United States Patent [19]

Eberlein et al.

[11] Patent Number: 4,962,356
[45] Date of Patent: Oct. 9, 1990

[54] INTEGRATED CIRCUIT TEST SOCKET

[75] Inventors: Delvin D. Eberlein, Altoona; Peter Wehner, Eau Claire, both of Wis.

[73] Assignee: Cray Research, Inc., Minneapolis, Minn.

[21] Appl. No.: 234,818

[22] Filed: Aug. 19, 1988

[51] Int. Cl.⁵ .......................... B01R 1/02; B01R 1/04
[52] U.S. Cl. .............................. 324/158 F; 324/72.5; 324/158 P
[58] Field of Search ........... 324/158 P, 158 F, 73 PC, 324/72.5; 361/121, 122, 213, 229, 231; 73/37.7, 37.8, 49.4, 199

[56] References Cited

U.S. PATENT DOCUMENTS

| | | | |
|---|---|---|---|
| 2,794,444 | 6/1957 | Markey | 73/37.7 |
| 3,243,993 | 4/1966 | Jacobsen | 73/37.7 |
| 3,260,435 | 7/1966 | Jacobsen | 73/37.7 |
| 3,341,099 | 9/1967 | Jacobsen | 73/37.7 |
| 3,970,934 | 7/1976 | Akou | 324/158 F |
| 4,031,741 | 6/1977 | Schaming | 73/37.7 |
| 4,104,696 | 8/1978 | Cochran, Jr. | 361/231 |
| 4,536,051 | 8/1985 | Smith et al. | 324/158 F |
| 4,694,245 | 9/1987 | Frommes | 324/158 F |
| 4,812,754 | 3/1989 | Tracy et al. | 324/158 F |
| 4,829,241 | 5/1989 | Maelzer | 324/158 F |

FOREIGN PATENT DOCUMENTS 3016483 11/1981 Fed. Rep. of Germany ... 324/158 F

Primary Examiner—Reinhard J. Eisenzopf
Assistant Examiner—W. Burns
Attorney, Agent, or Firm—Merchant, Gould, Smith, Edell, Welter & Schmidt

[57] ABSTRACT

Improved performance and reliability is obtained in test sockets for integrated circuits (ICs). Sufficient overtravel is provided to prevent pinching when the IC and its carrier are inserted in the test socket and the lid is latched closed. A power operated piston applies controllable and uniform pressure to force the IC leads onto contact pins in the test socket base. This controllable and uniform pressure prevents gouged IC leads, bent test socket pins, and other damage that prevents proper electrical and mechanical contact between IC leads and contact pins resulting in erroneous indications of faulty IC operation.

2 Claims, 3 Drawing Sheets 4,962,356

INTEGRATED CIRCUIT TEST SOCKET

TECHNICAL FIELD OF THE INVENTION

The present invention pertains generally to devices that test integrated circuits (ICs), and more particularly to an improved test socket which is capable of making, on a repetitive basis, reliable connections between the IC leads and the test socket's contact pins.

BACKGROUND OF THE INVENTION

Packaged ICs are usually tested by way of a test socket or test socket/carrier combination. Many such test sockets utilize a lid or cover plate which serves the purpose of positioning and holding the ICs in place such that intimate contact is made between the IC leads and the test socket contact pins. The lid will also allow for quick insertion and removal of the IC.

Most prior designs include a lid which is either hinged to the test socket base along one edge or clipped to the test socket base along several edges, both of which are intended to clamp the IC down onto the contact pins of the test socket as the lid is closed. Unfortunately, during closure it has been found that the hinged or clipped lid concept results in a dynamic component of force being exerted in a non-normal direction. The normal direction is indicated by a vector perpendicular to the plane of the test socket. Furthermore, the magnitude of this component will vary as a function of the hinge angle or clip arrangement. As IC lead and contact pin counts increase with newer generations of ICs, both the leads and pins become finer and thus more fragile. Any applied force in other than the normal direction will tend to deform or otherwise decrease pin life. This is a constant problem in industries such as computer manufacturing in which large numbers of very complex, high pin count ICs are used.

Most prior designs include lids which incorporate a lever, spring, screw, or other mechanism for pressing the IC down onto contact pins in the base of the test socket to make electrical contact between the leads of the IC and the pins of the test socket. In these prior art designs, the applied force to press the IC down onto the contact pins and the dimension between the test socket pins and the lid are both mechanically fixed. This results in a contact force between the IC leads and test socket pins determined in part by the mechanical tolerances of subassemblies (i.e., test socket, test socket lid with pressure mechanism, IC carrier, as well as the IC itself). The applied force for a given IC and test socket configuration cannot be adjusted easily.

An inherent weakness in the prior art design of IC test sockets is the inability to compensate for the mechanical tolerances of the subassemblies. For example, for a given test socket over a distribution of carriers and integrated circuits there exist a range of thinner IC/carrier combinations whereby a loose fit may result which would lead to marginal (high resistance) or no (open circuit) contact between some IC leads of the IC under test and the pins of the test socket. Another example is that for thicker IC carrier combinations, the pressing force will become extremely large resulting in gouged IC leads, bent test socket pins, or test socket pins that over-travel in their compressed state and lose elasticity. When the next ICs are tested, the bent, deformed or non-elastic test socket pins will not make electrical/mechanical contact to all the IC leads under test. This results in some IC leads showing high resistance or open circuit, indicating defective ICs when in fact it is unreliable test socket connections. A test socket that becomes progressively more unreliable with use is a major concern in all testing environments.

SUMMARY OF THE INVENTION

The present invention replaces manual test sockets which operate on lever/pressure principles.

One object of the present invention is to provide fluid-pressure power operated means for applying pressure to the IC so that the IC leads make reliable contact with the test socket contact pins.

Another object of the present invention is to provide a regulator so that the amount of force applied to the IC can be controlled.

Still another object of the present invention is to provide an accumulator so that the force is applied to the IC in a soft and gradual manner.

An additional object of the present invention is the elimination of non-normal force applied to the IC. In the past, test results would indicate that an IC is defective when, in fact, the test socket was deficient because it did not make reliable connections.

BRIEF DESCRIPTION OF THE DRAWINGS

In the drawings, where like numerals refer to like elements throughout the several views.

DETAILED DESCRIPTION OF A PREFERRED EMBODIMENT

In the following detailed description of the preferred embodiment, reference is made to the accompanying drawings which form a part hereof, and in which is shown by way of illustration a specific embodiment in which the invention may be practiced. It is to be understood that other embodiments may be utilized without departing from the scope of the present invention.

Figure 1:
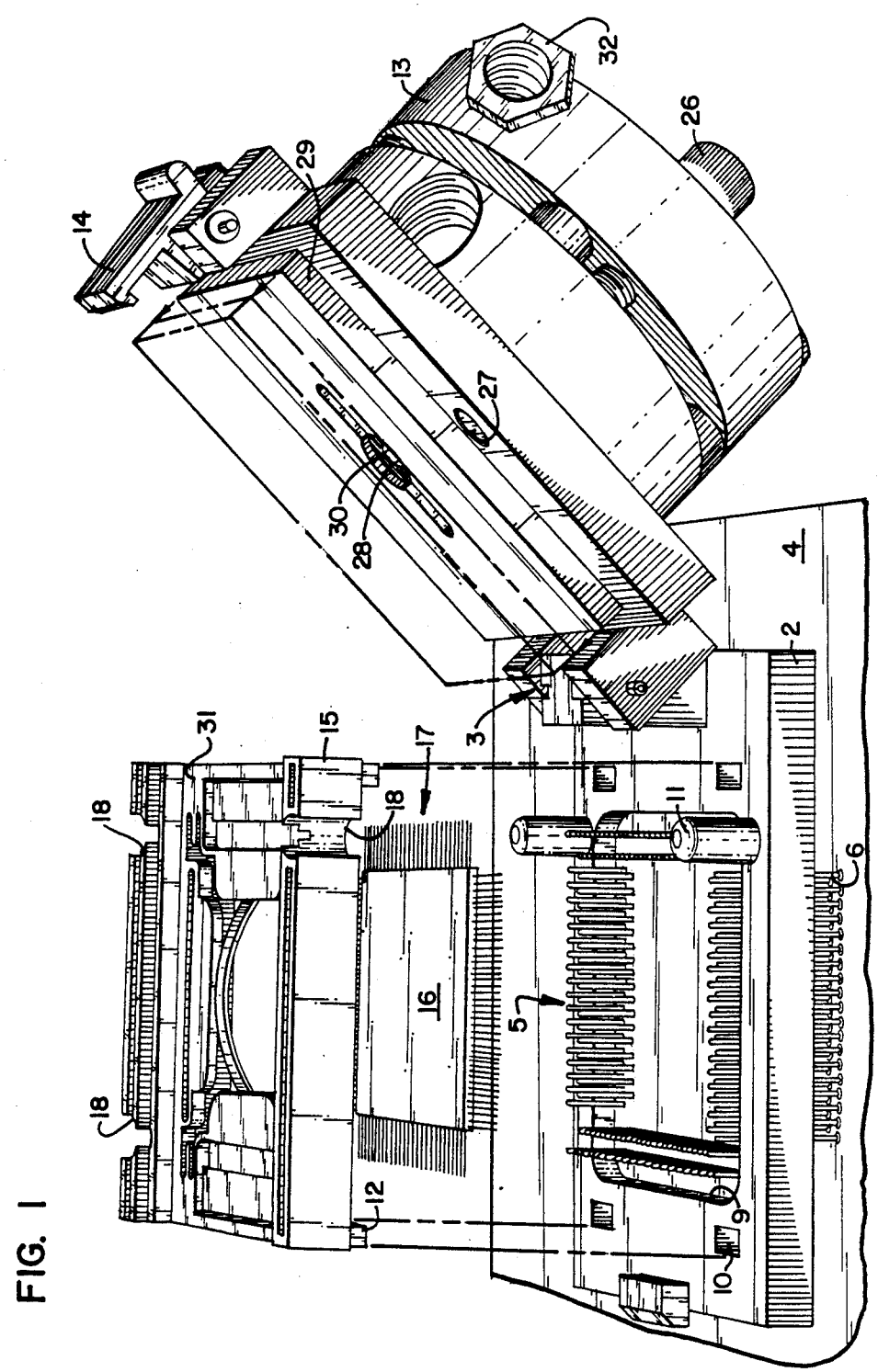
FIG. 1 is a detailed drawing of the test socket apparatus according to one embodiment of the present invention.

Referring to FIG. 1 initially, the base 2 of the test socket is identical in both the prior art and this present invention in its shape and in its usage. The base 2 contains a recessed area 9 whose sides are lined with contact pins 5. The recessed area 9 matches in size and shape the IC 16.

The IC carrier 15 is a molded plastic device that follows the same general shape as the IC 16, only it is slightly larger. The IC 16 is held firmly by the IC carrier 15. The IC carrier 15 protects the IC 16 on all sides, thereby shielding the fragile IC leads 17 and IC 16 from damage before, during, and after electrical test as well as providing support for the IC leads 17 during electrical test. The IC carrier 15 contains protrusions 12 that conform to holes 10 in the base 2. The protrusions 12 and holes 10 guide and firmly seat the IC carrier 15 in the test socket base 2 without any slipping or sliding. Conversely, the IC carrier 15 has holes 18 that match the protrusions 11 in the test socket base 2. The IC carrier 15 is designed so that the IC leads 17 are exposed to contact pins 5 in the test socket base 2.

Figure 3:
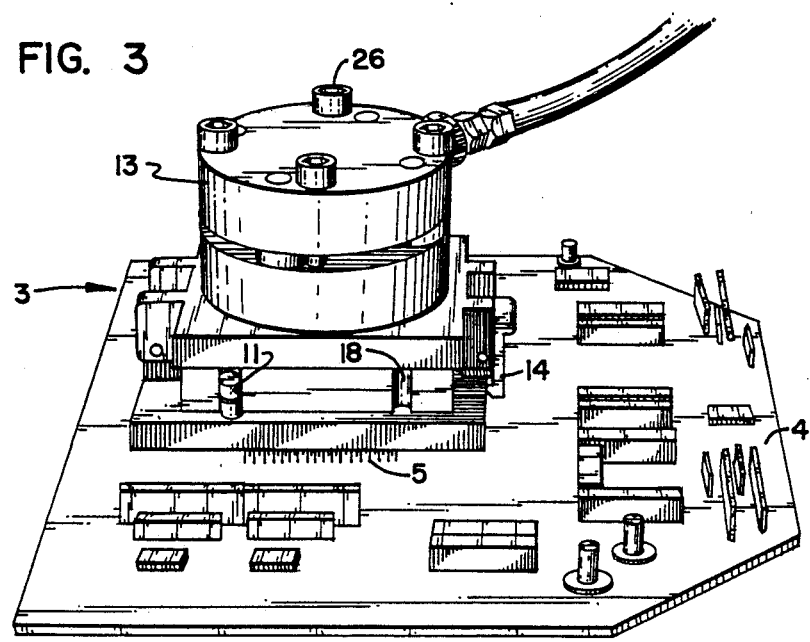
FIG. 3 is a top view perspective of the preferred embodiment.

The recessed area 9 in the base 2 is lined along the sides with contact pins 5. These contact pins 5 extend vertically and are arranged in an offset manner just within the sides of the recessed area 9. The contact pins 5 extend through the base 2 and protrude slightly, enough that the base 2 is supported by the contact pins 5 when placed on a flat surface. These protruding contact pins 5 correspond to contact pin holes 6 in a test circuit "daughterboard" 4. The base 2 is usually soldered to the daughterboard 4. The contact pins 5 provide the electrical contact with the IC leads 17 and the daughterboard 4 provides easy access to each and every one of the IC leads 17 so that the inputs and outputs to the IC 16 can be readily tested. A second illustration of a daughterboard 4 in relation to the test socket is shown in FIG. 3.

Figure 2:
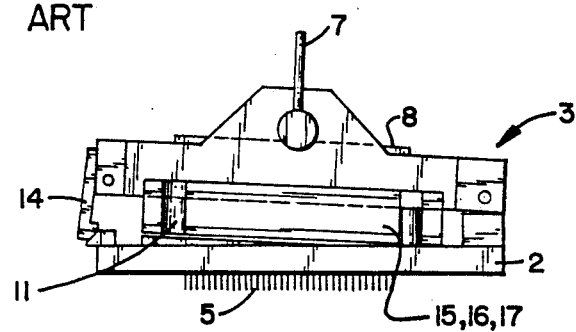
FIG. 2 is a detailed drawing of a prior art design for a test socket apparatus.

Referring now to FIG. 2, prior art lids 1 use leverage principles to apply force to the IC 16 and IC carrier 15 combination. The goal in applying this force is to ensure that the contact pins 5 and the IC leads 17 are in electrical contact with each other. To accomplish this, a typical prior art design has a lid 1 that includes a hinge 3 and latch 14 which together act to clamp the IC 16 down onto the contact pins 5 of the test socket base 2. In such a prior art design, the IC 16 and the IC carrier 15 combination are placed onto the base 2 and the lid 1 is closed until the latch 14 is secured. At this point, some degree of force is exerted on the IC 16 and IC carrier 15 combination because the amount of play between the lid 1 and the test socket base 2 is less than the width of the IC carrier 15. This force presses the IC leads 17 onto the contact pins 5. The problem with the hinged lid concept is that it results in a component of the total applied force being exerted in a non-normal direction.

The normal direction is indicated by a vector perpendicular to the plane of the test socket. Futhermore, the magnitude of this component will vary as a function of the hinge angle. As the number of IC leads 17 and corresponding contact pins 5 increase, both become finer and thus more fragile. Any applied force in a direction other than the normal direction will tend to decrease the life of the contact pins 5 in the test socket base 2. Contact pins 5 and leads 17 closest to the hinge 3 are subject to the greatest "pinching" force.

Once the IC 16 and IC carrier 15 combination are seated in the base 2, and the lid 1 is latched via 14, pressure is manually applied using leverage principles. The lever 7 is pressed downward forcing the pressure pad 8 onto the top of the IC carrier 15. This leverage principle results in inaccurate estimates as to the magnitude of the force being applied to the IC carrier 15. The amount of force cannot be varied except by "feel". As the number of IC leads 17 and corresponding contact pins 5 multiply, the pressure required to make low resistant ohmic contact between IC leads 17 and pins 5 greatly increase.

The major change associated with the present invention is the new design for the test socket lid 1. As in the prior art, the lid 1 of the preferred embodiment may be comprised of the same material as the base 2. In this embodiment as in the prior art described earlier, the lid 1 is attached to the base 2 with a hinge 3. Other variations may allow the lid 1 to be clipped onto the base 2. Typically, the lid 1 also supports a latch 14 so that the base 2, the IC 16 and IC carrier 15 combination, and lid 1 are all securely fastened together.

Where the present invention differs from the prior art is in its use of a pneumatically actuated piston to apply force to ensure that the contact pins 5 and the IC leads 17 are in contact with each other. Referring again to FIG. 1, combined with lid 1 is one or more pneumatically actuated pistons 13, and the optional latch mechanism 14. The piston 13 is a standard, commercially available unit. A connector 32 joins the piston 13 with other pneumatic components of the preferred embodiment, described herein later in conjunction with FIG. 4. FIG. 3 shows a hose 33 joined to the connector 32.

Bolt holes 27 are drilled into the lid 1 and bolts 26 are used to secure the piston 13 to the lid 1. Other means or variations may be used to secure the pneumatically actuated piston 13 to the lid 1. Four bolts 26 are used in the preferred embodiment, although only one can be viewed from the perspective of FIG. 1. All four bolts can be viewed from the perspective of FIG. 3. A center hole 28 is drilled through the lid 1 so that the piston 13 may extend freely through lid 1.

A pressure plate 29 is attached to the piston 13, and is used as a plunger to apply the force to the IC 16 and IC carrier 15 combination. The pressure plate 29 has dimensions that match the top of the IC carrier 15. A threaded hole is drilled through the center of the pressure plate 29. The piston 13 has complementary threads on the end that extends through the lid 1. The piston 13 and pressure plate 29 are mated together by threading the piston 13 through the center hole 30 in the pressure plate 29. The piston 13 and pressure plate 29 may also be mated together by a fixture which allows the pressure plate 29 to swivel, applying even pressure onto a non-planar IC/carrier surface.

The hinge 3 and latch mechanism 14 extend vertically more than similar hinges and latches in prior art designs. The resulting over-travel or built-in play between the test socket lid 1, base 2, and the IC 16 and IC carrier 15 combination, prevents any force from being applied to the IC 16 and IC carrier 15 combination as the lid 1 is latched to the base 2. When the IC 16 and IC carrier 15 combination are seated in the base 2, the IC leads 17 and contact pins 5 are in close proximity or may touch, but just barely. The only force applied is the weight of the IC 16 and IC carrier 15 combination. Additional force is applied only when the piston 13 is actuated by the operator.

As a safety measure, and to prevent any kind of a non-normal force, an optional sensor (not shown) can be installed to be actuated by the lid, in its closed position. The sensor can be connected to the pressure supply so that the piston 13 cannot be actuated unless the lid 1 is latched to the base 2.

Figure 4:
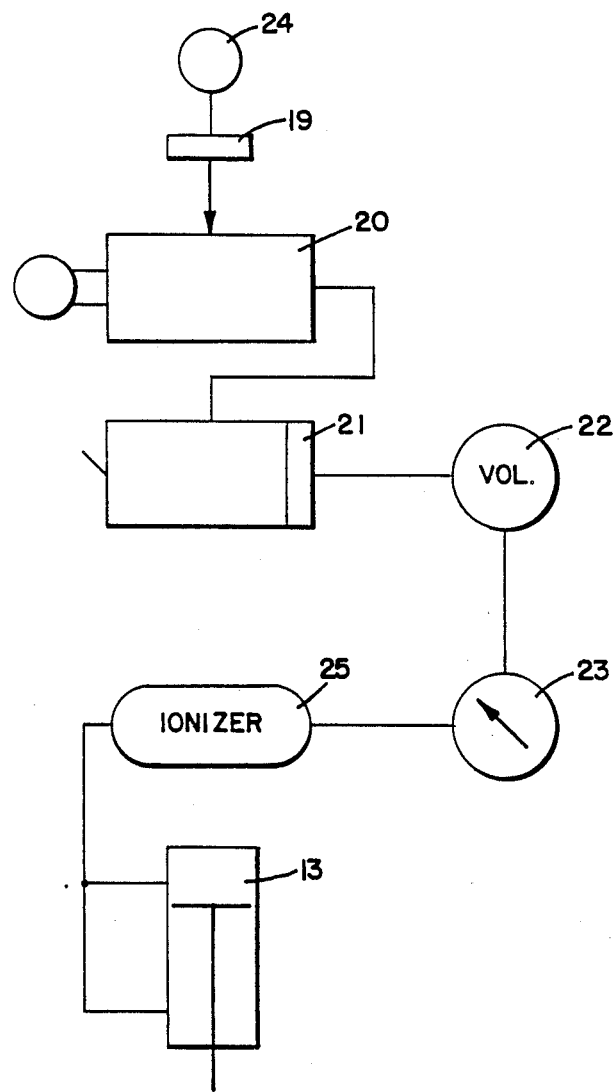
FIG. 4 is a block diagram of the pneumatic components of the apparatus according to one embodiment of the present invention.

FIG. 4 describes the pneumatic components of the preferred embodiment. To activate for testing purposes, the operator connects a pressurized line 24 to the intake manifold 19. The magnitude of the desired force is determined by the operator manipulating the regulator 20 and observing the reading on the pressure gauge 23. The on/off valve 21 is toggled to permit the fluid-pressure flow into the device and to actuate the piston 13. As the piston 13 is actuated, it will deliver a constant force to the IC 16 and IC carrier 15 combination. In turn, this ensures that the contact pins 5 in the base 2 and the IC leads 17 are in contact with each other. The ability to vary the total force acting on the IC leads 17 and the contact pins 5 and the base 2 will aid in minimizing the electrical resistance between the IC leads 17 and the contact pins 5.

The regulator 20 allows the total force to be applied in a controlled manner which becomes more important as IC lead counts multiply and the IC leads themselves become finer and more fragile. Additionally, the applied force acts entirely in the normal direction, thus eliminating skidding between IC leads 17 and contact pins 5 in the base 2. The normally applied force will also help minimize gouging or other damage to IC leads 17. Contact pins 5 in the base 2 will be less likely to suffer from bending and foldover. The number in insertions before test socket failure will increase as a result of the force being applied in a normal direction. An accumulator 22 provides for a soft and gradual application of force that protects the IC 16, IC leads 17, and contact pins 5 from mechanical shock. When an optional ionizer 25 is included, the IC 16 is also protected from damaging static charges.

Although a specific configuration has been illustrated and described for the preferred embodiment of the present invention set forth herein, it will be appreciated by those of ordinary skill in the art that any arrangement which is calculated to achieve the same purpose may be substituted for the preferred embodiment shown. Thus, the present invention disclosed herein may be implemented through the use of a plurality of pneumatically actuated pistons, rather than the single piston in the preferred embodiment. It will be readily appreciated by those of ordinary skill in the art that although a pneumatically actuated piston has been used herein, an electro-mechanically actuated piston may be alternatively substituted. Additionally, such alternative native embodiments would require that electrical switches and gauges be employed. This application is intended to cover any adaptations or variations of the present invention. Therefore, it is manifestly intended that this invention be limited only by the claims and the equivalents thereof.

What is claimed is:

1. Apparatus for testing integrated circuits comprising:
   (a) a base for supporting an integrated circuit to be tested, said base having a plurality of contact pins mounted therein and positioned for contacting the leads extending from an integrated circuit positioned on said base;
   (b) a lid and means operatively connected thereto for positioning said lid over said base and an integrated circuit supported thereon;
   (c) lid attachment means for providing built-in play between said lid, said base, and said integrated circuit, thereby minimizing any pinching force on said integrated circuit and providing for the quick insertion and removal of said integrated circuit;
   (d) fluid-pressure power operated pressure means carried by said lid and operative when energized for applying uniform pressure in a normal direction to an integrated circuit to be tested, thereby minimizing gouging and skidding between the contact pins and leads and ensuring that the leads make reliable low ohmic and uniform electrical contact with the contact pins;
   (e) control means for regulating said uniform pressure applied by said power operated pressure means, thereby ensuring a constant pressure on said integrated circuit independent of any built-in play between said lid, said base, and said integrated circuit;
   (f) said fluid-pressure power operated pressure means comprising an ionizer for removing a static charge from said fluid-pressure.

2. Apparatus for testing integrated circuits, comprising:
   (a) a base for supporting an integrated circuit to be tested, said base having a plurality of contact pins mounted therein and positioned for contacting the leads extending from an integrated circuit positioned on said base;
   (b) a lid and means operatively connected thereto for positioning said lid over said base and an integrated circuit supported thereon;
   (c) lid attachment means for providing built-in play between said lid, said base, and said integrated circuit, thereby minimizing any pinching force on said integrated circuit and providing for the quick insertion and removal of said integrated circuit;
   (d) fluid-pressure power operated pressure means carried by said lid and operative when energized for applying uniform pressure in a normal direction to an integrated circuit to be tested, thereby minimizing gouging and skidding between the contact pins and leads and ensuring that the leads make reliable low ohmic and uniform electrical contact with the contact pins;
   (e) control means for regulating said uniform pressure applied by said power operated pressure means, thereby ensuring a constant pressure on said integrated circuit independent of any built-in play between said lid, said base, and said integrated circuit; and
   (f) said fluid-pressure power operated pressure means comprising a fluid-pressure power source, at least one piston, an on/off switch for enabling and disabling the operation of said piston, a first connector for joining said power source to said on/off switch, a regulator for applying to said piston a variable amount of said power source, a gauge for displaying the variable amount of said power source applied by said regulator, at least one accumulator for regulating the rate of increase in the variable amount of said power source applied by said regulator, and a second connector for joining said accumulator to said piston.

* * * * *

UNITED STATES PATENT AND TRADEMARK OFFICE
CERTIFICATE OF CORRECTION

PATENT NO. : 4,962,356

DATED : October 9, 1990

INVENTOR(S) : Delvin D. Eberlein, Peter Wehner

It is certified that error appears in the above-identified patent and that said Letters Patent is hereby corrected as shown below:

In column 5, line 31, delete the word "native".

Signed and Sealed this

Thirty-first Day of March, 1992

Attest:

HARRY F. MANBECK, JR.

*Attesting Officer*     *Commissioner of Patents and Trademarks*